United States Patent
Bayer et al.

(10) Patent No.: US 10,144,062 B2
(45) Date of Patent: Dec. 4, 2018

(54) METHOD AND DEVICE FOR PRODUCING A COMPONENT OF A TURBOMACHINE

(75) Inventors: Erwin Bayer, Dachau (DE); Karl-Hermann Richter, Markt Indersdorf (DE)

(73) Assignee: MTU Aero Engines GmbH, Munich (DE)

(*) Notice: Subject to any disclaimer, the term of this patent is extended or adjusted under 35 U.S.C. 154(b) by 1370 days.

(21) Appl. No.: 13/504,888

(22) PCT Filed: Sep. 30, 2010

(86) PCT No.: PCT/DE2010/001155
§ 371 (c)(1), (2), (4) Date: Apr. 27, 2012

(87) PCT Pub. No.: WO2011/050765
PCT Pub. Date: May 5, 2011

(65) Prior Publication Data
US 2012/0213659 A1    Aug. 23, 2012

(30) Foreign Application Priority Data
Oct. 30, 2009   (DE) .......................... 10 2009 051 479

(51) Int. Cl.
*B22F 3/105* (2006.01)
*B23K 35/00* (2006.01)
(Continued)

(52) U.S. Cl.
CPC ............ *B22F 3/1055* (2013.01); *B23K 26/32* (2013.01); *B23K 26/342* (2015.10);
(Continued)

(58) Field of Classification Search
CPC .... B22F 1/025; B22F 2999/00; B22F 3/1055; B23K 35/005
(Continued)

(56) References Cited

U.S. PATENT DOCUMENTS

| | | | |
|---|---|---|---|
| 5,038,014 A | | 8/1991 | Pratt et al. |
| 6,046,426 A | * | 4/2000 | Jeantette ............ B01F 13/0255 219/121.63 |

(Continued)

FOREIGN PATENT DOCUMENTS

| | | |
|---|---|---|
| DE | 199 03 436 A1 | 8/2000 |
| DE | 20 2004 021 233 U1 | 5/2007 |

(Continued)

OTHER PUBLICATIONS

German Search Report, dated Jul. 21, 2010, 5 pages total.
PCT/DE2010/001155 PCT/ISA/210, dated Mar. 28, 2011, 3 pages.

*Primary Examiner* — Weiping Zhu
(74) *Attorney, Agent, or Firm* — Crowell & Moring LLP

(57) ABSTRACT

A method for producing a component of a turbomachine is disclosed. The method includes a) layer-by-layer deposition of a powder component material onto a component platform in a region of a buildup and joining zone, where the deposition takes place in accordance with layer information of the component to be produced; b) local layer-by-layer fusion or sintering of the powder component material by energy supplied in the region of the buildup and joining zone, where the buildup and joining zone is heated to a temperature just below a melting point of the powder component material; c) layer-by-layer lowering of the component platform by a predefined layer thickness; and d) repetition of steps a) to c) until the component is finished. A device for producing a component of a turbomachine is also disclosed.

14 Claims, 1 Drawing Sheet

(51) Int. Cl.
   *B23K 35/02*   (2006.01)
   *B32B 18/00*   (2006.01)
   *C04B 35/16*   (2006.01)
   *C30B 29/52*   (2006.01)
   *B23K 26/32*   (2014.01)
   *B23K 26/342*  (2014.01)
   *B23K 101/00*  (2006.01)
   *B23K 103/14*  (2006.01)
   *B23K 103/00*  (2006.01)
   *B23K 103/18*  (2006.01)

(52) U.S. Cl.
   CPC .......... *B23K 35/005* (2013.01); *B23K 35/007* (2013.01); *B23K 35/0244* (2013.01); *B32B 18/00* (2013.01); *C04B 35/16* (2013.01); *C30B 29/52* (2013.01); *B22F 2998/00* (2013.01); *B22F 2999/00* (2013.01); *B23K 2201/001* (2013.01); *B23K 2203/14* (2013.01); *B23K 2203/26* (2015.10); *B23K 2203/52* (2015.10); *C04B 2235/6026* (2013.01); *C04B 2235/665* (2013.01); *C04B 2237/341* (2013.01); *Y02P 10/295* (2015.11)

(58) Field of Classification Search
   USPC .......................................................... 419/53
   See application file for complete search history.

(56) References Cited

U.S. PATENT DOCUMENTS

| | | |
|---|---|---|
| 7,211,763 B2 | 5/2007 | Zhang |
| 2004/0112280 A1* | 6/2004 | Beck et al. ................. 117/84 |
| 2004/0200404 A1 | 10/2004 | Brice |
| 2005/0173380 A1 | 8/2005 | Carbone |
| 2007/0038176 A1* | 2/2007 | Weber et al. ............ 604/93.01 |
| 2010/0151145 A1 | 6/2010 | Richter et al. |

FOREIGN PATENT DOCUMENTS

| | | |
|---|---|---|
| DE | 10 2006 058 949 A1 | 6/2008 |
| EP | 0 861 927 A1 | 9/1998 |
| EP | 1 400 339 A1 | 3/2004 |
| WO | WO 2008/046386 A1 | 4/2008 |
| WO | WO 2008/046388 A1 | 4/2008 |
| WO | WO 2010/092374 A1 | 8/2010 |

* cited by examiner

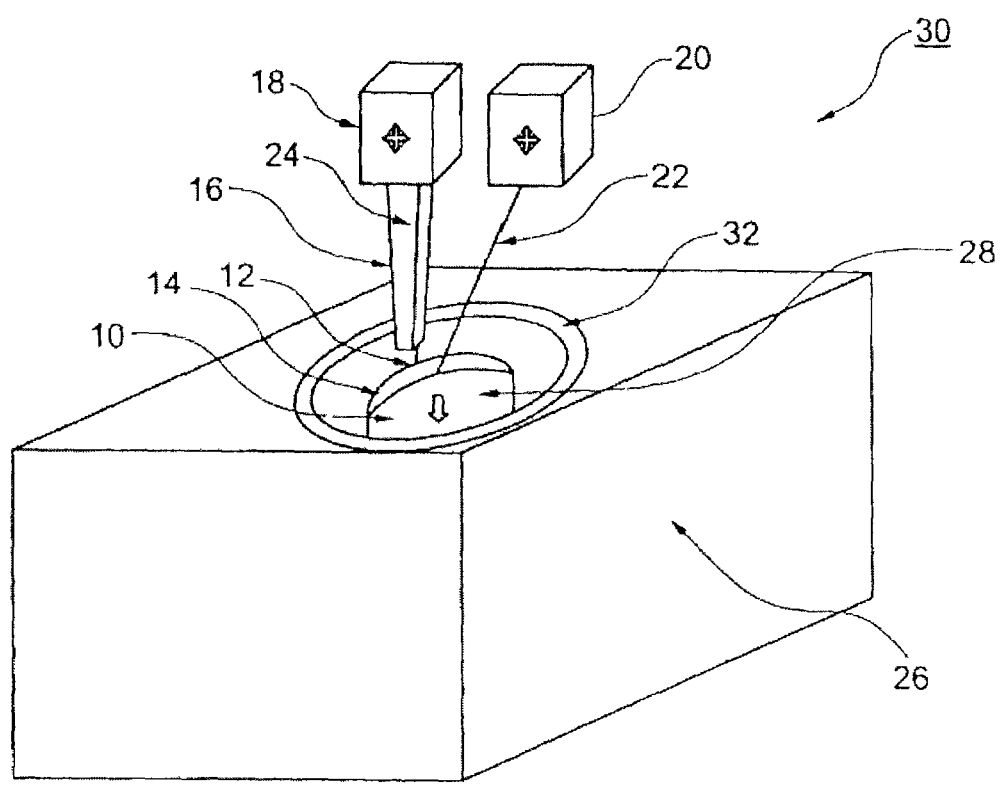

US 10,144,062 B2

METHOD AND DEVICE FOR PRODUCING A COMPONENT OF A TURBOMACHINE

This application claims the priority of International Application No. PCT/DE2010/001155, filed Sep. 30, 2010, and German Patent Document No. 10 2009 051 479.1, filed Oct. 30, 2009, the disclosures of which are expressly incorporated by reference herein.

BACKGROUND AND SUMMARY OF THE INVENTION

The present invention relates to a method for producing a component of a turbomachine, especially a hollow structural part of a turbine or a compressor. The invention also relates to a device for producing a component of a turbomachine, especially a hollow structural part of a turbine or a compressor.

Complex hollow, especially metallic or at least partially metallic, structural parts for high-temperature applications, such as, for example, high-pressure turbine blades are produced as a rule by means of precision casting with a directionally solidified or monocrystalline structure. The purpose of the directional solidification is avoiding grain boundaries which run perpendicular to the effective direction of the centrifugal force, because these adversely affect the creep behavior of the component. Monocrystalline structures do not have any grain boundaries at all and their creep properties are optimal as a result. However, the fineness of the hollow structure is limited by the casting process, the casting core and its distance. Thus, in casting technology according to the lost-wax method, for example, the production of the ceramic cores and the leachability thereof limit the fineness of the inner structures of the hollow structural part being produced and therefore the stiffness of the component as well as its cooling effect. For example, the enlargement of the inner surfaces, the formation of a grid structure to increase the stiffness and for improved heat exchange is no longer possible with current casting technologies without an increase in mass.

As a result, the object of the present invention is providing a method for producing a component of a turbomachine of the type cited at the outset, which makes the production of finely structured components, especially hollow structural parts of a turbine or a compressor, possible.

It is furthermore the object of the present invention to provide a device for producing a component of a turbomachine, which makes the production of finely structured components, especially hollow structure components of a turbine or a compressor, possible.

Advantageous embodiments with expedient further developments of the invention are disclosed in the respective dependent claims, wherein, where appropriate, advantageous embodiments of the method should be considered to be advantageous embodiments of the device and vice versa.

A method according to the invention for producing a component of a turbomachine, especially a hollow structural part of a turbine or a compressor, comprises the following steps: a) layer-by-layer deposition of at least one powder component material onto a component platform in the region of a buildup and joining zone, the deposition taking place in accordance with the layer information of the component to be produced; b) local layer-by-layer fusion or sintering of the component material by means of energy supplied in the region of the buildup and joining zone, wherein the environment of the buildup and joining zone is heated to a temperature just below the melting point of the component material; c) layer-by-layer lowering of the component platform by a predefined layer thickness; and d) repetition of steps a) to c) until the component is finished. By using a generative fabrication method, it is possible to produce finely structured components, especially hollow structural parts of a turbine or a compressor. In doing so, it is possible to produce components that can no longer be produced using casting technology such as, for example, structural parts having grid structures for increasing the structural strength with low dead weight and for considerably increasing the inner surfaces to improve cooling efficiency. In addition, it is possible by means of the generative construction method to incorporate boreholes directly into the structure for diverting the cooling air from the component. Because of heating the buildup and joining zone to a temperature just below the melting point of the component material, it is also possible to influence and control the crystal structure of the component being produced. In this case, especially a rapid prototyping method or rapid manufacturing method such as, for example, a laser beam deposition welding or an electron beam (EB) powder deposition welding is used as a generative fabrication method. The powder component material in this case may be made of metal, a metal alloy, ceramic, silicate or a mixture thereof. If the laser deposition welding is used as the generative fabrication method, then especially a $CO_2$ laser, Nd:YAG laser, Yb-fiber laser or a diode laser may be used. Alternatively, an EB-beam may also be used.

In another advantageous embodiment of the method according to the invention, a first layer of the powder component material is applied in process step a) in such a way and solidified in process step b) in such a way that at least one directionally solidified or monocrystalline basic body of the component to be produced is formed on the component platform. However, it is also possible that, prior to the layer-by-layer deposition of the powder component material according to process step a), at least one directionally solidified or monocrystalline basic body of the component to be produced is applied on the component platform, wherein the contour of the basic body corresponds to the basic contour of the component in this component section. The basic body is a requirement for the design of a directionally solidified or monocrystalline component. These types of components have optimal creep properties. In particular, the additional layers of the powder component material deposited on the basic body in process step a) are applied in such a way that the directionally solidified or monocrystalline component is formed. The deposited additional layers grow epitaxially on the basic body and have the crystallographic orientation of the basic body. When depositing the powder component material, the growth of the component may be controlled by means of the parameters of laser output, feed rate, powder grain diameter and/or powder supply rate. In doing so, the process parameters conform to the component materials used.

In another advantageous embodiment of the method according to the invention, synchronously to the deposition or directly after the deposition of a layer of the component material, a laser ablation or EB removal of material protrusions is carried out to adapt the respective component section to a predetermined component contour in this region. Because of this process step, the degree of fineness of the structures is significantly improved once again because the excess material is removed with an ablation laser or EB-beam. In addition, there is the possibility that the cited removal, in particular the laser ablation, is carried out as a function of measurement data of the contours of the component in the respective component section recorded and processed by at least one optical measuring system. A short pulse laser in particular may be used for the laser ablation.

In another advantageous embodiment of the method according to the invention, the shape and material structure of the component is determined as a computer-generated model and the layer information generated therefrom is used to control at least one powder feed, the component platform, at least one deposition laser or at least one electron beam (EB) powder deposition device. As a result, automated and computer-controlled production processes are possible.

In other advantageous embodiments of the method according to the invention, the heating of the buildup and joining zone to a temperature just below the melting point of the component material is carried out in a high temperature zone of a zone furnace. The zone furnace is especially advantageous in the production of components with directionally solidified or monocrystalline crystal structure, because the zone furnace makes it possible to maintain a predetermined temperature gradient perpendicular to the solidification front. To this end, in particular the component to be produced may be moved from the high temperature zone of the zone furnace by means of the component platform to at least one zone having a lower temperature.

A device according to the invention for producing a component of a turbomachine, especially a hollow structural part of a turbine or a compressor, comprises at least one powder feed for depositing at least one powder component material on a component platform in the region of a buildup and joining zone, means for heating the buildup and joining zone to a temperature just below the melting point of the component material as well as at least one radiation source for a local layer-by-layer fusion or sintering of the component material by means of energy supplied in the region of the buildup and joining zone. The device according to the invention makes the production of finely structured components possible, especially of hollow structural parts of a turbine or a compressor of a turbomachine. This is caused in particular in that the device for carrying out a generative fabrication method, such as, for example, a rapid prototyping method or rapid manufacturing method, in particular a laser beam deposition welding, an electron beam (EB) powder deposition welding or deposit welding is aligned with wire. In contrast to known casting methods, much smaller and finely formed structures may be produced. By heating the buildup and joining zone to a temperature just below the melting point of the component material it is also possible to influence and control the crystal structure of the component being produced. A laser or an electron beam device may be provided as a radiation source for the input of energy in the buildup and joining zone. In the case of the use of a laser, in particular a $CO_2$ laser, Nd:YAG laser, Yb-fiber laser or a diode laser may be used. The powder component material may in turn be made of metal, a metal alloy, ceramic, silicate or a mixture thereof.

In another advantageous embodiment of the device according to the invention, the powder feed or deposit welding with wire is arranged coaxially or laterally to the radiation source. As a result, the device may be adapted in an optimal manner to the space available for the respective task.

In another advantageous embodiment of the device according to the invention, the means for heating the buildup and joining zone comprise a zone furnace. By using a zone furnace, a predetermined temperature gradient may be maintained perpendicular to the solidification front of the growing component so that, for example, components with a directionally solidified or monocrystalline crystal structure may be produced.

In another advantageous embodiment of the device according to the invention, the means for heating the buildup and joining zone are designed to be at least partially evacuable or floodable with an inert gas. This permits the welding quality to be improved substantially.

In other advantageous embodiments of the device according to the invention, the device comprises at least one ablation laser for a laser ablation of material protrusions to adapt a component section to a predetermined component contour. To this end, the ablation laser may be coupled with at least one optical measuring system. The laser ablation is carried out as a function of measurement data of the contours of the component in the respective component section recorded and processed by the optical measuring system. By comparing the measured contours to a predetermined final contour, it is possible to correspondingly control the ablation laser so that excess material is removed from the component. This makes a further improvement in the quality of the fine structures of the component possible. A short pulse laser is normally used as the ablation laser. However, it is also conceivable for the removal of excess material to be carried with the electron beam.

The method according to the invention described in the foregoing and the device according to the invention likewise described in the foregoing is used for producing engine components made of nickel-based or titanium-based alloys, especially for producing compressor blades or turbine blades.

BRIEF DESCRIPTION OF THE DRAWING

The FIGURE shows a schematic representation of a device for producing a component of a turbomachine in accordance with the principles of the present invention.

DETAILED DESCRIPTION OF THE DRAWING

Additional advantages, features and details of the invention are disclosed in the following description of a graphically depicted exemplary embodiment. In this case, the FIGURE shows a schematic representation of a device 30 for producing a component 10 of a turbomachine. The component 10 in the depicted exemplary embodiment is a rotor blade of a high-pressure turbine. The device 30 in this case comprises a radiation source 18, specifically a laser for the deposition of a powder component material 16. A Nd:YAG laser is used as the laser in the depicted exemplary embodiment. Depending upon the type of component, especially the blade type, the laser output is between 400 and 1000 W in particular. The average grain size of the powder component material 16 used is approx. 10 to 100 µm. The component material 16 in this case is made in particular of a titanium or nickel alloy. In addition, the device 30 has a powder feed 24 for deposition of the powder component material 16 as well as a component platform (not shown) in the region of a buildup and joining zone 14. The buildup and joining zone 14 is formed inside a zone furnace 26. The component 10 is guided through the zone furnace 26 by means of the component platform. To heat the buildup and joining zone 14 to a temperature just below the melting point of the component material 16, the buildup and joining zone 14 is surrounded by an induction coil 32 of the zone furnace 26. In addition, the buildup and joining zone 14 is located in a high temperature zone 28 of the zone furnace 26. The component 10 to be produced in this case is moved during production by means of the component platform from the high temperature zone 28 to a zone having a lower temperature (see arrow display).

One can see that in the depicted example, the powder feed 24 is arranged coaxially to the radiation source 18, specifically the laser. The generated laser beam and powder stream 12 is fused or sintered in the region of the buildup and joining zone 14 to a component layer. The device 30 also has a second radiation source, specifically an ablation laser 20 for a laser ablation of material protrusions to adapt the respective component section to a predetermined component contour. The removal of excess material takes place in this case by the laser beam 22 generated by the ablation laser 20 as a function of measurement data of the respective component contour recorded and processed by an optical measuring system (not shown). The measurement data are compared with the saved data of the final contour of the component 10 in the respective layer section, wherein the possible deviations of the final contour are removed by the ablation laser 20. In the depicted exemplary embodiment, the ablation laser 20 is a short pulse laser. The optical measuring system may be configured separately or integrated into the ablation laser 20.

In addition, the zone furnace 26 of the device 30 is designed to be at least partially evacuable or floodable with an inert gas. The quality of the welding processes is thereby increased.

The fabrication of the component 10 is described as an example in the following:

To begin with, the shape and the material structure of the component 10 are determined as a computer-generated model (CAD model) in a computer. The layer information that is thereby generated is input as corresponding data into a control computer (not shown) of the device 30. These data are used to control the powder feed 24, the component platform, the deposition laser 18 and the ablation laser 20. The cited computer may be used in the process also as a control computer of the device 30.

In further production steps, a layer-by-layer deposition of the powder component material 16 onto the component platform in the region of the buildup and joining zone 14 is carried out according to a first process step a). In a next process step b), a local layer-by-layer fusion or sintering of the component material 16 takes place by means of laser energy in the region of the buildup and joining zone 14. Then a layer-by-layer lowering of the component platform within the zone furnace 26 by a predefined layer thickness is carried out in another process step c). The process steps a) to c) are repeated until the component 10 is finished. The deposition laser 18 and the ablation laser 20 are respectively guided according to the layer information of the component 10 to be produced. To produce a component 10 with a directionally solidified or monocrystalline crystal structure, the powder deposition takes place epitaxially, i.e., in that at least one first layer of the powder component material 16 is deposited in process step a) in such a way and strengthened in process step b) in such a way that at least one directionally solidified or monocrystalline basic body of the component 10 to be produced is formed on the component platform. However, it is also possible that, prior to the layer-by-layer deposition of the powder component material 16 according to process step a), at least one directionally solidified or monocrystalline basic body of the component 10 to be produced is applied to the component platform, wherein the contour of the basic body corresponds to the basic contour of the component 10 in this component section. The layers of the powder component material 16 subsequently applied to the basic body are then applied in process step a) in such a way and strengthened in process step b) in such a way that a directionally solidified or monocrystalline component 10 is formed.

The invention claimed is:

1. A method for producing a component of a turbomachine, comprising the steps of:
   a) feeding a powder component and supplying radiation from a source coaxially to provide layer-by-layer deposition of a powder component material onto a component platform in a region of a buildup and joining zone formed within a furnace, wherein the deposition takes place in accordance with layer information of the component to be produced;
   b) local layer-by-layer fusing or sintering the powder component material by energy supplied in the region of the buildup and joining zone, wherein the buildup and joining zone is heated to a temperature just below a melting point of the powder component material;
   c) layer-by-layer lowering of the component platform into the furnace by a predefined layer thickness; and
   d) repeating steps a) to c) until the component is finished.

2. The method according to claim 1, wherein the component is a hollow structural part of a turbine or a compressor.

3. The method according to claim 1, wherein the deposition utilizes laser deposition welding or electron beam powder deposition welding.

4. The method according to claim 3, wherein a gas laser, a solid-state laser or a diode laser is used for the laser deposition welding.

5. The method according to claim 1, wherein the powder component material is made of a metal, a metal alloy, a ceramic, a silicate or a mixture thereof.

6. The method according to claim 1, wherein a first layer of the powder component material is applied in method step a) and strengthened in method step b) such that a directionally solidified or monocrystalline basic body of the component to be produced is formed on the component platform.

7. The method according to claim 6, wherein layers of the powder component material are deposited on the basic body in method step a) and strengthened in method step b) such that a directionally solidified or monocrystalline component is formed.

8. The method according to claim 1, wherein prior to the layer-by-layer deposition of the powder component material according to method step a), a directionally solidified or monocrystalline basic body of the component to be produced is applied to the component platform, and a contour of the basic body of the component corresponds to a basic contour of the component.

9. The method according to claim 1, wherein, synchronously with the deposition or directly after the deposition of a layer of the powder component material, a laser ablation of material protrusions is performed.

10. The method according to claim 9, wherein the laser ablation is performed as a function of measurement data of contours of the component in a respective component section recorded and processed by an optical measuring system.

11. The method according to claim 9, wherein a short pulse laser is used for the laser ablation.

12. The method according to claim 1, wherein a shape and a material structure of the component are determined as a computer-generated model and layer information generated therefrom is used to control at least one of a powder feed, the component platform, a deposition laser, and an electron beam powder deposition device.

13. The method according to claim 1, wherein heating of the buildup and joining zone is carried out to the temperature just below the melting point of the component material in a high temperature zone of the furnace, and the furnace is a zone furnace.

14. The method according to claim 13, wherein the component to be produced is moved from the high temperature zone of the zone furnace by the component platform to a zone having a lower temperature.

* * * * *